United States Patent
Kim et al.

(10) Patent No.: US 10,937,668 B2
(45) Date of Patent: Mar. 2, 2021

(54) SEMICONDUCTOR PACKAGE MANUFACTURING METHOD

(71) Applicant: DISCO CORPORATION, Tokyo (JP)

(72) Inventors: Youngsuk Kim, Tokyo (JP); Byeongdeck Jang, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/353,629

(22) Filed: Mar. 14, 2019

(65) Prior Publication Data
US 2019/0295859 A1    Sep. 26, 2019

(30) Foreign Application Priority Data

Mar. 20, 2018 (JP) .............................. JP2018-052128

(51) Int. Cl.
| | |
|---|---|
| *H05K 3/30* | (2006.01) |
| *H05K 1/18* | (2006.01) |
| *H01L 23/522* | (2006.01) |
| *H01L 23/36* | (2006.01) |
| *H01L 21/56* | (2006.01) |

(Continued)

(52) U.S. Cl.
CPC .......... *H01L 21/561* (2013.01); *H01L 21/568* (2013.01); *H01L 21/78* (2013.01); *H01L 23/3128* (2013.01); *H01L 23/367* (2013.01); *H01L 23/49822* (2013.01); *H01L 23/544* (2013.01); *H01L 21/565* (2013.01); *H01L 24/48* (2013.01); *H01L 2223/54433* (2013.01); *H01L 2224/48227* (2013.01)

(58) Field of Classification Search
CPC ........... H01L 29/0847; H01L 29/78696; H01L 29/66772; H01L 29/78654; H01L 21/2236; H01L 29/775; H01L 29/6653; H01L 29/401; H01L 29/1037; H01L 29/6681; H01L 29/0653; H01L 29/0673; H01L 29/0665; H01L 29/7853; H01L 21/31111; H01L 29/66439; H01L 29/42392; B82Y 10/00
See application file for complete search history.

(56) References Cited

U.S. PATENT DOCUMENTS

| | | | | |
|---|---|---|---|---|
| 2002/0098608 | A1* | 7/2002 | Tandy | ............... H01L 21/67282 438/26 |
| 2008/0265395 | A1* | 10/2008 | Hasegawa | ............... H01L 24/97 247/690 |

(Continued)

FOREIGN PATENT DOCUMENTS

JP    2001023936 A    1/2001

*Primary Examiner* — Brian Turner
(74) *Attorney, Agent, or Firm* — Greer Burns & Crain Ltd.

(57) ABSTRACT

A semiconductor package manufacturing method includes the steps of bonding a plurality of semiconductor chips to the front side of a wiring substrate, next supplying a sealing compound to the front side of the wiring substrate to thereby form a sealing layer from the sealing compound on the front side of the wiring substrate, thereby forming a package substrate, next holding the package substrate on a holding tape, next cutting the front side of the resin layer by using a profile grinding tool to thereby form a plurality of ridges and grooves on the front side of the resin layer, thereby increasing the surface area of the front side of the resin layer, and next dividing the package substrate along each division line to obtain a plurality of individual semiconductor packages.

9 Claims, 9 Drawing Sheets

(51) Int. Cl.
*H01L 21/78* (2006.01)
*H01L 23/498* (2006.01)
*H01L 23/31* (2006.01)
*H01L 23/367* (2006.01)
*H01L 23/544* (2006.01)
*H01L 23/00* (2006.01)

(56) References Cited

U.S. PATENT DOCUMENTS

| | | | |
|---|---|---|---|
| 2009/0095510 A1* | 4/2009 | Ono | H01L 24/97 |
| | | | 174/254 |
| 2009/0294930 A1* | 12/2009 | Yoon | H01L 24/97 |
| | | | 257/660 |
| 2013/0122689 A1* | 5/2013 | Wang | H01L 25/0655 |
| | | | 438/464 |
| 2013/0292848 A1* | 11/2013 | Na | H01L 23/36 |
| | | | 257/774 |
| 2015/0243575 A1* | 8/2015 | Strothmann | H01L 24/97 |
| | | | 257/773 |
| 2016/0336275 A1* | 11/2016 | Kim | H01L 23/544 |
| 2017/0047264 A1* | 2/2017 | Im | H01L 21/563 |
| 2017/0222104 A1* | 8/2017 | Shimada | H01L 33/486 |
| 2017/0257977 A1* | 9/2017 | Chainer | B29C 45/14655 |

* cited by examiner

SEMICONDUCTOR PACKAGE MANUFACTURING METHOD

BACKGROUND OF THE INVENTION

Field of the Invention

The present invention relates to a semiconductor package manufacturing method for manufacturing a semiconductor package including a semiconductor chip sealed with a sealing compound.

Description of the Related Art

A conventional semiconductor package is manufactured by sealing (packaging) a semiconductor chip with a sealing compound (see Japanese Patent Laid-open No. 2001-23936, for example). In the semiconductor package manufacturing method described in Japanese Patent Laid-open No. 2001-23936, a plurality of semiconductor chips are mounted on a wiring substrate, and next collectively sealed with a sealing compound such as a molding resin at one time to form a package substrate including the wiring substrate, the plural semiconductor chips mounted on the wiring substrate, and a sealing layer (resin layer) formed from the sealing compound so as to seal the plural semiconductor chips. Thereafter, the package substrate is divided along each division line by dicing to thereby obtain a plurality of individual semiconductor packages each including the semiconductor chip sealed with the sealing layer.

SUMMARY OF THE INVENTION

In each semiconductor package, it is desired to protect each semiconductor chip from an external environment such as impact and foreign matter and also to dissipate heat generated in each semiconductor chip to the outside of the semiconductor package. However, in the configuration such that each semiconductor chip is simply sealed with the sealing layer, there is a limit to the performance of heat dissipation from each semiconductor package. Accordingly, it is required to further improve the performance of heat dissipation from each semiconductor package.

It is therefore an object of the present invention to provide a semiconductor package manufacturing method which can improve the performance of heat dissipation from each semiconductor package including the semiconductor chip sealed with the sealing layer.

In accordance with an aspect of the present invention, there is provided a semiconductor package manufacturing method for manufacturing a plurality of individual semiconductor packages, including a holding step of holding a package substrate by using a holding jig or a holding tape, the package substrate being previously formed by bonding a plurality of semiconductor chips to a plurality of separate regions on a front side of a wiring member, the separate regions being defined by a plurality of crossing division lines, and next supplying a sealing compound to the front side of the wiring member to thereby form a sealing layer from the sealing compound on the front side of the wiring member, whereby the package substrate is composed of the wiring member, the semiconductor chips bonded to the wiring member, and the sealing layer sealing the semiconductor chips, a back side of the wiring member of the package substrate being held by the holding jig or the holding tape; a ridge forming step of cutting a front side of the sealing layer to a depth not reaching a front side of each semiconductor chip by using a profile grinding tool having an uneven working surface after performing the holding step, thereby forming a plurality of ridges and grooves on the front side of the sealing layer to thereby increase a surface area of the front side of the sealing layer; and a dividing step of dividing the package substrate along each division line to obtain the plurality of individual semiconductor packages.

With this configuration, a front side of the sealing layer is cut to a depth not reaching a front side of each semiconductor chip by using the uneven working surface of the profile grinding tool, thereby forming the asperities on the front side of the sealing layer, so that a surface area of the front side of the sealing layer can be increased without any damage to each semiconductor chip. Accordingly, the heat generated from each semiconductor chip is transmitted to the uneven front side of the sealing layer and then efficiently dissipated from the uneven front side of the sealing layer due to the asperities.

In accordance with another aspect of the present invention, there is provided a semiconductor package manufacturing method for manufacturing a plurality of individual semiconductor packages, including a holding step of holding a package substrate by using a holding jig or a holding tape, the package substrate being previously formed by bonding a plurality of semiconductor chips to a plurality of separate regions on a front side of a wiring member, the separate regions being defined by a plurality of crossing division lines, and next supplying a sealing compound to the front side of the wiring member to thereby form a sealing layer from the sealing compound on the front side of the wiring member, whereby the package substrate is composed of the wiring member, the semiconductor chips bonded to the wiring member, and the sealing layer sealing the semiconductor chips, a back side of the wiring member of the package substrate being held by the holding jig or the holding tape; and a dividing step of cutting the package substrate along each division line to a depth corresponding to the middle of a thickness of the holding tape or corresponding to an inside of the holding jig by using a profile grinding tool after performing the holding step, thereby dividing the package substrate into the plurality of individual semiconductor packages; the profile grinding tool having at least two projections arranged so as to correspond to any adjacent ones of the division lines and an uneven working surface formed between the two projections; the dividing step including the steps of cutting the package substrate along the division lines by using the two projections to thereby divide the package substrate into the individual semiconductor packages and simultaneously cutting a front side of the sealing layer to a depth not reaching a front side of each semiconductor chip by using the uneven working surface, thereby forming a plurality of ridges and grooves on the front side of the sealing layer to thereby increase a surface area of the front side of the sealing layer.

With this configuration, the profile grinding tool has the two projections for fully cutting the package substrate. Accordingly, the package substrate is fully cut along the corresponding division lines by the two projections of the profile grinding tool to thereby divide the package substrate into the individual semiconductor packages. At the same time, the front side of the sealing layer is cut to the depth not reaching the front side of each semiconductor chip by the uneven working surface of the profile grinding tool, thereby forming the asperities on the front side of the sealing layer, so that the surface area of the front side of the sealing layer can be increased without any damage to each semiconductor chip. Accordingly, the heat generated from each semiconductor chip is transmitted to the uneven front side of the sealing layer and then efficiently dissipated from the uneven front side of the sealing layer due to the asperities. In this manner, the package substrate is divided and at the same time the asperities are formed on the front side of the sealing layer, so that the heat dissipation from each semiconductor package can be improved with a reduced number of steps.

In accordance with a further aspect of the present invention, there is provided a semiconductor package manufacturing method for manufacturing a plurality of individual semiconductor packages, including a chip bonding step of bonding a plurality of semiconductor chips to a plurality of separate regions on a front side of a wiring member, the separate regions being defined by a plurality of crossing division lines; a package substrate forming step of setting a mold on a front side of the wiring member so as to define a space between the mold and the front side of each semiconductor chip, the mold having an uneven inner surface, and next supplying a sealing compound into the space defined between the mold and the front side of each semiconductor chip to thereby form a sealing layer from the sealing compound on the wiring member, a front side of the sealing layer being formed with a plurality of ridges and grooves transferred from the uneven inner surface of the mold, thereby obtaining a package substrate composed of the wiring member, the semiconductor chips bonded to the wiring member, and the sealing layer sealing the semiconductor chips; and a dividing step of dividing the package substrate along each division line to obtain the plurality of individual semiconductor packages after performing the package substrate forming step.

With this configuration, the plural semiconductor chips are sealed with the sealing compound by using the mold having the uneven inner surface to thereby form the asperities on the front side of the sealing layer due to the transfer of the asperities of the uneven inner surface of the mold. Thus, the surface area of the front side of the sealing layer in the package substrate can be increased. Accordingly, the heat generated from each semiconductor chip is transferred to the uneven front side of the sealing layer and then efficiently dissipated from the uneven front side of the sealing layer due to the asperities. Furthermore, the surface area of the front side of the sealing layer can be increased without machining, thereby suppressing an increase in load on an operator in forming the asperities on the front side of the sealing layer. That is, by using the mold to form the asperities on the front side of the sealing layer, the heat dissipation from each semiconductor chip can be improved with a reduced number of steps.

Preferably, the semiconductor package manufacturing method according to the present invention further comprises an ID mark forming step of forming an ID mark on one side surface of each semiconductor package after performing the dividing step.

According to the present invention, the asperities are formed on the front side of the sealing layer to thereby increase the surface area of the front side of the sealing layer. Accordingly, the heat generated from each semiconductor chip is transmitted to the uneven front side of the sealing layer and then efficiently dissipated from the uneven front side of the sealing layer due to the asperities, thus improving the heat dissipation from each semiconductor package.

The above and other objects, features, and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
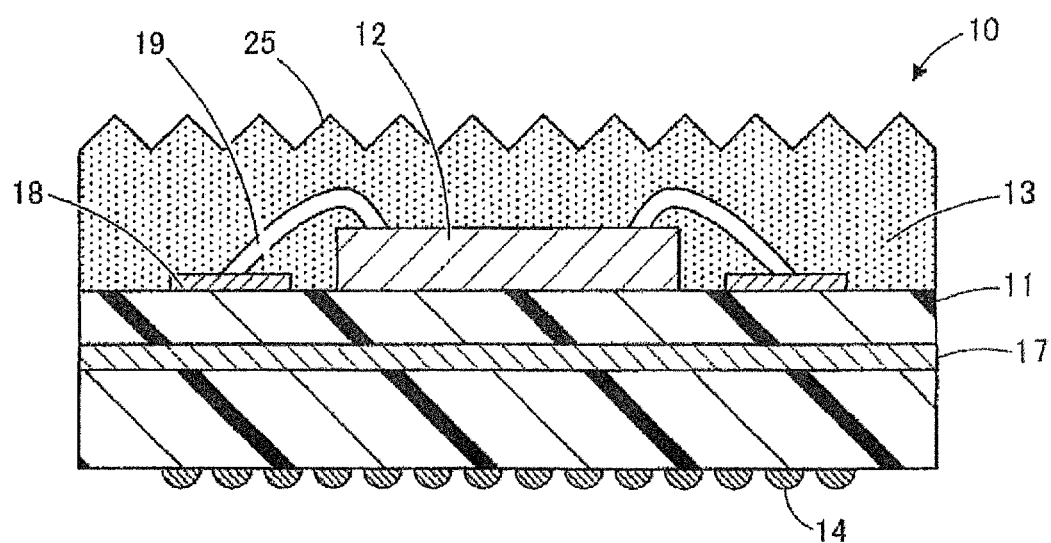
FIG. 1 is a schematic sectional view of a semiconductor package manufactured by the method according to the present invention.
Figure 2:
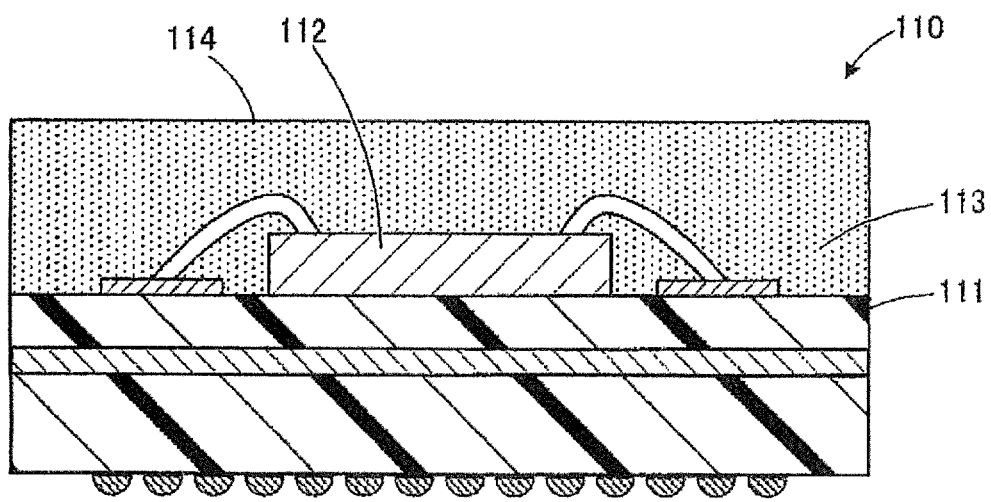
FIG. 2 is a schematic sectional view of a usual semiconductor package manufactured by a conventional method as a comparison for illustrating heat dissipation.

A semiconductor package manufacturing method according to a preferred embodiment of the present invention will now be described with reference to the attached drawings. FIG. 1 is a schematic sectional view of a semiconductor package 10 manufactured by the method according to this preferred embodiment. FIG. 2 is a schematic sectional view of a usual semiconductor package 110 manufactured by a conventional method as a comparison for illustrating heat dissipation. The following preferred embodiment is merely illustrative. For example, a certain step may be interposed between the adjacent steps of the manufacturing method or the order of the steps of the manufacturing method may be suitably changed.

As depicted in FIG. 1, the semiconductor package 10 is a packaged semiconductor device having a semiconductor chip 12 sealed with a resin layer (sealing layer, sealing compound) 13. The resin layer 13 functions to protect the semiconductor chip 12 from an external environment. In the semiconductor package 10, the semiconductor chip 12 is mounted on the upper surface (front side) of a wiring substrate (wiring member) 11, and a plurality of bumps 14 are provided on the lower surface (back side) of the wiring substrate 11. The wiring substrate 11 is formed with various wiring including electrodes 18 and a ground line 17. The electrodes 18 are connected through wires 19 to the semiconductor chip 12. Further, an ID mark (not depicted) for package identification is provided on the side surface of the semiconductor package 10.

In general, there is a case that a malfunction may occur in the semiconductor chip 12 because of vibration, impact, moisture, dust, magnetism, etc. Accordingly, the semiconductor chip 12 must be properly protected from such an external environment. Further, when the semiconductor chip 12 is operated, heat is generated from the semiconductor chip 12. In the event that the temperature of the semiconductor chip 12 itself increases, there is a possibility that the semiconductor chip 12 may improperly operate and may be broken. Accordingly, the temperature of the semiconductor chip 12 must be maintained at a temperature lower than or equal to a proof operating temperature. In this manner, the semiconductor package 10 is required not only to protect the semiconductor chip 12 from an external environment such as impact and foreign matter, but also to dissipate the heat generated from the semiconductor chip 12 to the outside of the semiconductor package 10.

As depicted in FIG. 2, the usual semiconductor package 110 as a comparison includes a wiring substrate 111, a semiconductor chip 112 mounted on the upper surface of the wiring substrate 111, and a resin layer 113 formed on the upper surface of the wiring substrate 111 so as to seal the semiconductor chip 112, in which the semiconductor package 110 has a flat upper surface 114. When heat is generated from the semiconductor chip 112 in the semiconductor package 110, the heat is transmitted to the resin layer 113 and then dissipated from the flat upper surface 114 of the semiconductor package 110. However, when the amount of heat generated from the semiconductor chip 112 becomes large, it is difficult to sufficiently dissipate the heat from the upper surface 114 and thereby to properly remove the heat from the semiconductor chip 112. It is therefore necessary to further improve the heat dissipation from the semiconductor package 110.

The heat dissipation from the semiconductor package 110 may be improved by reducing the thickness of the resin layer 113 formed on the semiconductor chip 112. However, the mechanical strength of the semiconductor package 110 may be reduced to cause a problem such that the semiconductor chip 112 cannot be protected from physical damage or the like. To cope with this problem, the semiconductor package 10 depicted in FIG. 1 according to this preferred embodiment has an uneven upper surface 25 increased in surface area. Accordingly, the heat generated from the semiconductor chip 12 is transmitted to the uneven upper surface 25 of the semiconductor package 10 and then efficiently dissipated from the uneven upper surface 25 because of an increase in surface area, thereby improving the heat dissipation from the semiconductor package 10. As a result, it is possible to improve the heat dissipation from the semiconductor package 10 in the condition where a reduction in mechanical strength can be suppressed.

Figure 3A:
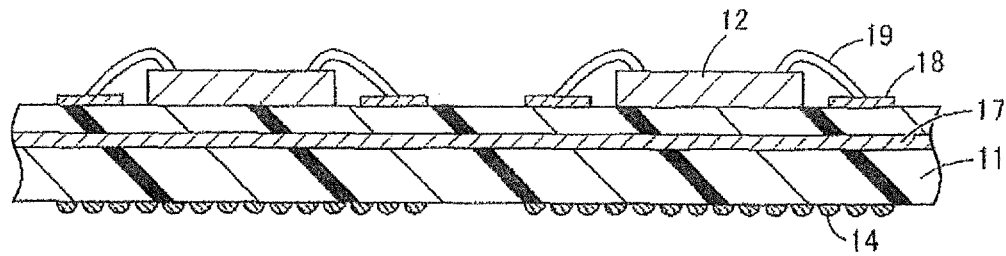
FIG. 3A is a sectional view depicting a chip bonding step according to a first preferred embodiment of the present invention.
Figure 3B:
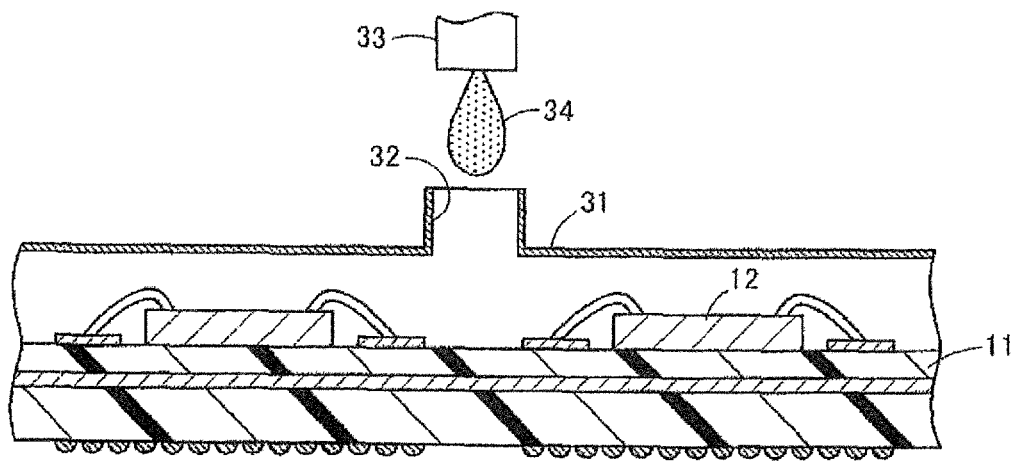
FIG. 3B is a sectional view depicting a package substrate forming step according to the first preferred embodiment.
Figure 3C:
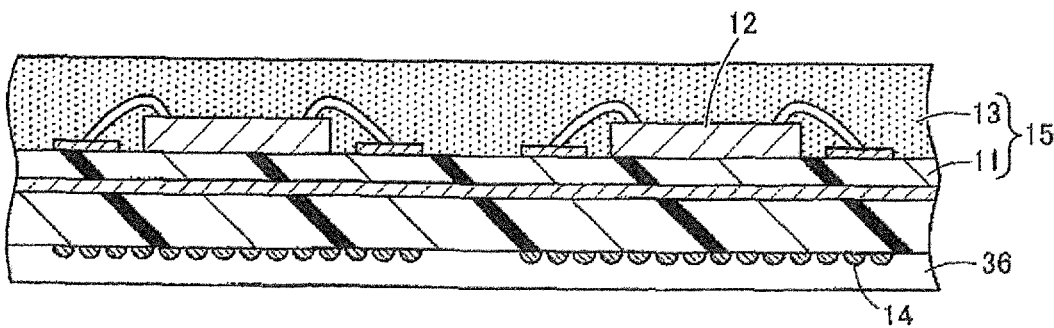
FIG. 3C is a sectional view depicting a holding step according to the first preferred embodiment.
Figure 4A:
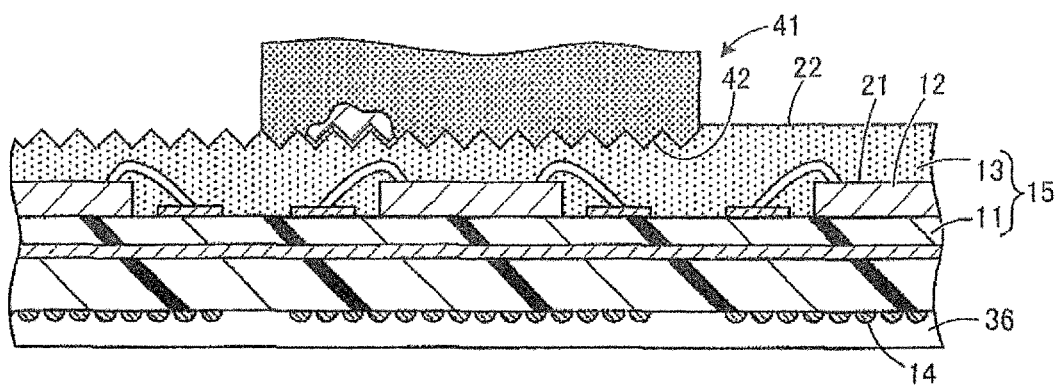
FIG. 4A is a sectional view depicting a ridge forming step according to the first preferred embodiment.
Figure 4B:
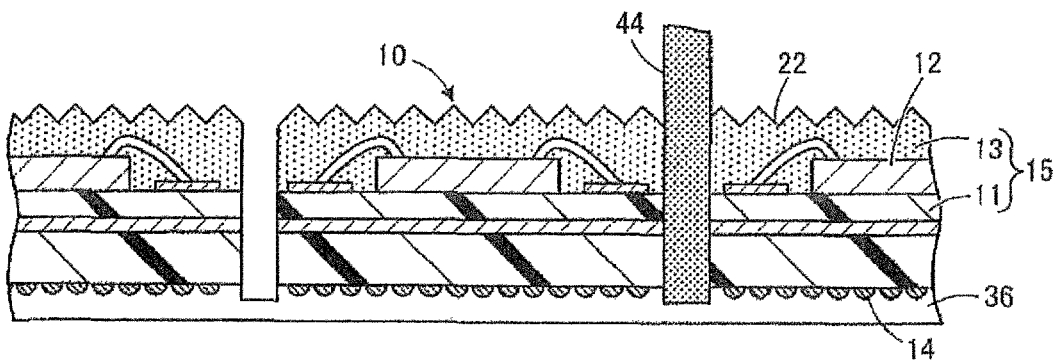
FIG. 4B is a sectional view depicting a dividing step according to the first preferred embodiment.
Figure 4C:
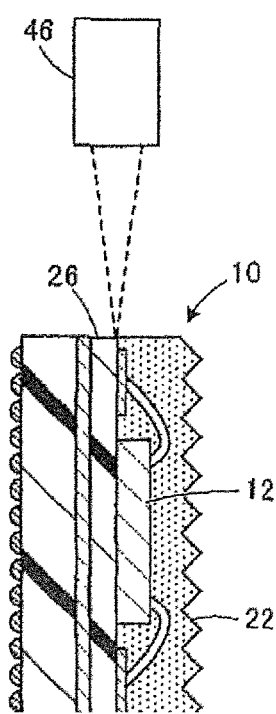
FIG. 4C is a sectional view depicting an ID mark forming step according to the first preferred embodiment.

A semiconductor package manufacturing method according to a first preferred embodiment of the present invention will now be described with reference to FIGS. 3A to 3C and FIGS. 4A to 4C. FIGS. 3A to 3C and FIGS. 4A to 4C are sectional views for illustrating the semiconductor package manufacturing method according to the first preferred embodiment. FIG. 3A depicts a chip bonding step, FIG. 3B depicts a package substrate forming step, and FIG. 3C depicts a holding step. FIG. 4A depicts a ridge forming step, FIG. 4B depicts a dividing step, and FIG. 4C depicts an ID mark forming step.

As depicted in FIG. 3A, the chip bonding step is first performed. In the chip bonding step, a wiring substrate 11 having a plurality of crossing division lines is prepared, in which the division lines are previously set on the upper surface (front side) of the wiring substrate 11 to thereby define a plurality of separate regions (device areas) for respectively mounting a plurality of semiconductor chips 12. Thereafter, the plural semiconductor chips 12 are bonded (mounted) on the upper surface of the wiring substrate 11 so as to be respectively located in the plural separate regions defined by the crossing division lines. More specifically, each semiconductor chip 12 is connected through wires 19 to the wiring substrate 11. Electrodes (not depicted) are previously formed on the upper surface of each semiconductor chip 12, and electrodes 18 are previously formed on the upper surface of the wiring substrate 11, in which one end of each wire 19 is connected to each electrode of the semiconductor chip 12, and the other end of each wire 19 is connected to each electrode 18 of the wiring substrate 11. Further, wiring including a ground line 17 is previously formed in the wiring substrate 11, and bumps 14 are provided on the lower surface (back side) of the wiring substrate 11. The bumps 14 function to transmit signals or the like to each semiconductor chip 12.

As depicted in FIG. 3B, the package substrate forming step is performed after performing the chip bonding step. In the package substrate forming step, a sealing compound 34 is supplied to the upper surface of the wiring substrate 11 on which the plural semiconductor chips 12 have been bonded, thereby sealing all the semiconductor chips 12 with the sealing compound 34 at one time to form a package substrate 15 (see FIG. 3C). More specifically, the lower surface of the wiring substrate 11 is held by a holding jig (not depicted), and a mold 31 is set so as to cover the upper surface of the wiring substrate 11. The mold 31 has an upper wall formed with an inlet opening 32, and a nozzle 33 for supplying the sealing compound 34 is positioned directly above the inlet opening 32.

In operation, the sealing compound 34 is supplied from the nozzle 33 through the inlet opening 32 to the upper surface of the wiring substrate 11 until the inside space (mold cavity) of the mold 31 is filled with the sealing compound 34, thereby sealing the semiconductor chips 12 with the sealing compound 34. Thereafter, the sealing compound 34 is heated or dried to be cured, thereby forming a resin layer 13 (see FIG. 3C) on the upper surface of the wiring substrate 11. Thus, the package substrate 15 is composed of the wiring substrate 11, the plural semiconductor chips 12 mounted on the upper surface of the wiring substrate 11, and the resin layer 13 formed on the upper surface of the wiring substrate 11 so as to seal the plural semiconductor chips 12. The sealing compound 34 is a curable liquid resin. Examples of the curable resin include epoxy resin, silicone resin, urethane resin, unsaturated polyester resin, acrylic urethane resin, and polyimide resin. While the sealing compound 34 is a liquid resin in this preferred embodiment, a sheet resin or a powder resin may be used instead. In the case that the package substrate 15 is previously formed, the chip bonding step and the package substrate forming step may be omitted.

As depicted in FIG. 3C, the holding step is performed after performing the package substrate forming step. In the holding step, a holding tape 36 is attached to the lower surface (back side) of the package substrate 15, that is, to the lower surface (back side) of the wiring substrate 11. The holding tape 36 is previously supported in its peripheral portion to a ring frame (not depicted) having a central opening. Accordingly, a central portion of the holding tape 36 is attached to the back side of the package substrate 15 in such a manner that the central opening of the ring frame is closed by the holding tape 36 and the package substrate 15 is located in the central opening of the ring frame. Thus, the package substrate 15 is supported through the holding tape 36 to the ring frame. The holding tape 36 has an adhesive layer, and the bumps 14 provided on the lower surface of the package substrate 15 (the wiring substrate 11) are embedded in the adhesive layer of the holding tape 36, thereby well holding the package substrate 15 on the holding tape 36. The holding step may be mechanically performed by dedicated apparatus such as a mounter or may be manually performed by an operator. Further, the ring frame may be a ring frame having a circular outside shape as viewed in plan or a ring frame having a rectangular outside shape as viewed in plan.

As depicted in FIG. 4A, the ridge forming step is performed after performing the holding step. In the ridge forming step, a profile grinding tool 41 having a substantially cylindrical shape is used, in which the cylindrical surface of the profile grinding tool 41 is formed as an uneven (ridged) working surface 42. That is, the axis of the cylindrical profile grinding tool 41 extends in a horizontal direction. The cylindrical surface of the profile grinding tool 41 is uneven as viewed in side elevation in such a manner that a plurality of ridges and grooves are alternately arranged in the axial direction of the profile grinding tool 41. The uneven working surface 42 is formed by electrodepositing abrasive grains such as diamond abrasive grains on the uneven cylindrical surface of the profile grinding tool 41. The height of each ridge of the working surface 42, that is, the depth of each groove of the working surface 42 is set smaller than the distance from the upper surface 21 of each semiconductor chip 12 to the upper surface 22 of the resin layer 13. Accordingly, even when the depth of cut on the upper surface 22 of the resin layer 13 by the working surface 42 of the profile grinding tool 41 becomes equal to the depth of each groove of the working surface 42, the ridges of the working surface 42 are prevented from reaching each semiconductor chip 12.

In operation, the wiring substrate 11 of the package substrate 15 is held through the holding tape 36 on a chuck table (not depicted). Thereafter, the profile grinding tool 41 is lowered at a position horizontally outside the package substrate 15 until the working surface 42 becomes lower in level than the upper surface 22 of the resin layer 13 and higher in level than the upper surface 21 of each semiconductor chip 12. In this condition, the package substrate 15 is moved in a horizontal direction (in a direction perpendicular to the sheet plane of FIG. 4A) as rotating the profile grinding tool 41 about its horizontal axis parallel to the sheet plane of FIG. 4A, thereby transferring the ridges and grooves of the working surface 42 of the profile grinding tool 41 to the upper surface 22 of the resin layer 13. That is, the upper surface 22 of the resin layer 13 is formed into an uneven surface having a plurality of ridges and grooves transferred from the uneven working surface 42, thereby increasing the surface area of the upper surface 22 of the resin layer 13. Further, since the working surface 42 of the profile grinding tool 41 does not reach each semiconductor chip 12, there is no possibility that each semiconductor chip 12 may be damaged in forming the ridges and grooves on the upper surface 22 of the resin layer 13 by using the profile grinding tool 41.

Such a ridge forming operation by the profile grinding tool 41 is repeated to form a plurality of arrays each consisting of the plural ridges and grooves mentioned above on the whole of the upper surface 22 of the resin layer 13. Thereafter, the chuck table is rotated 90 degrees to similarly repeat the above ridge forming operation, thereby forming a plurality of similar ridges and grooves extending in a direction perpendicular to the direction of extension of the previously formed ridges and grooves. Accordingly, a plurality of asperities each having a shape of quadrangular pyramid are formed on the upper surface 22 of the resin layer 13 of the package substrate 15, so that the surface area of the upper surface 22 of the resin layer 13 exposed to the ambient air can be increased to thereby improve the heat dissipation. The depth of cut by the profile grinding tool 41 is previously adjusted to a depth such that sufficient heat dissipation can be ensured in a semiconductor package 10 (see FIG. 4B) to be obtained by dividing the package substrate 15 and that sufficient mechanical strength can also be ensured in the semiconductor package 10.

As depicted in FIG. 4B, the dividing step is performed after performing the ridge forming step. The dividing step is performed by using a disk-shaped straight blade 44 having a uniform thickness. The straight blade 44 is formed by fixing diamond abrasive grains or the like with a bond. In operation, the wiring substrate 11 of the package substrate 15 is held through the holding tape 36 on a chuck table (not depicted). In this condition, the straight blade 44 is aligned with a predetermined one of the division lines of the package substrate 15. Thereafter, the straight blade 44 is lowered at a position horizontally outside the package substrate 15 until the cutting edge of the straight blade 44 reaches the depth corresponding to the middle of the thickness of the holding tape 36. Thereafter, the package substrate 15 is moved in a horizontal direction (in a direction perpendicular to the sheet plane of FIG. 4B) as rotating the straight blade 44 about its horizontal axis parallel to the sheet plane of FIG. 4B.

Accordingly, the package substrate 15 is fully cut along the predetermined division line by the straight blade 44 to the depth from the upper surface 22 of the resin layer 13 to the middle of the thickness of the holding tape 36. After the package substrate 15 is fully cut along the predetermined division line, the straight blade 44 is aligned to the next division line adjacent to the above predetermined division line, and the package substrate 15 is similarly fully cut along this next division line by the straight blade 44. This cutting operation is similarly repeated to thereby fully cut the package substrate 15 along all the division lines to thereby obtain a plurality of individual semiconductor packages 10 divided from each other. In this manner, the plural semiconductor packages 10 can be obtained from the package substrate 15, in which the heat dissipation from each semiconductor package 10 is improved by forming the asperities on the upper surface 22 of the resin layer 13.

As depicted in FIG. 4C, the ID mark forming step is performed after performing the dividing step. In the ID mark forming step, an ID mark is formed on one side surface 26 of each semiconductor package 10. In this case, each semiconductor package 10 is positioned directly below a laser head 46 in the condition where the side surface 26 of each semiconductor package 10 is directed upward. In this condition, the laser head 46 is operated to form the ID mark on the side surface 26 by laser marking. Accordingly, although the upper surface 25 of each semiconductor package 10 is uneven, the ID mark can be clearly formed on each semiconductor package 10.

In the semiconductor package manufacturing method according to the first preferred embodiment mentioned above, the upper surface 22 of the resin layer 13 is cut to the depth not reaching each semiconductor chip 12 by using the uneven working surface 42 of the profile grinding tool 41 thereby forming the asperities on the upper surface 22 of the resin layer 13, so that the surface area of the upper surface 22 of the sealing layer can be increased without any damage to each semiconductor chip 12. Accordingly, the heat generated from the semiconductor chip 12 of each semiconductor package 10 is transmitted to the uneven upper surface 22 of the resin layer 13 and then efficiently dissipated from the uneven upper surface 22 of the resin layer 13, thereby improving the heat dissipation from each semiconductor package 10.

Figure 5:
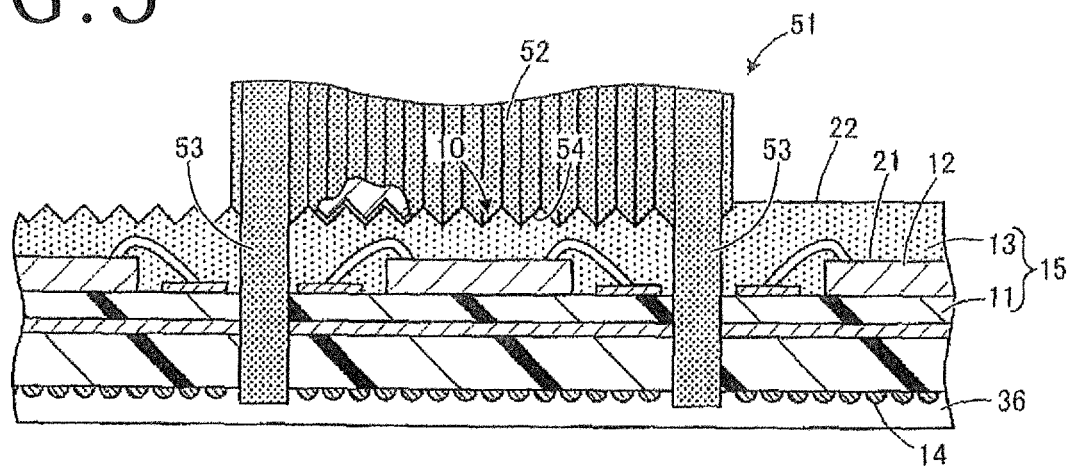
FIG. 5 is a sectional view for illustrating a semiconductor package manufacturing method according to a second preferred embodiment of the present invention.

A semiconductor package manufacturing method according to a second preferred embodiment of the present invention will now be described with reference to FIG. 5. The second preferred embodiment is different from the first preferred embodiment in the point that the dividing step in the second preferred embodiment includes the steps of forming asperities on a package substrate and simultaneously dividing the package substrate. Accordingly, the description of any steps other than the dividing step will be omitted herein. FIG. 5 is a sectional view for illustrating the semiconductor package manufacturing method according to the second preferred embodiment.

As depicted in FIG. 5, the dividing step is performed after performing a chip bonding step, a package substrate forming step, and a holding step in a manner similar to that mentioned above in the first preferred embodiment. The dividing step is performed by using a profile grinding tool 51 having an uneven working surface 54 for forming the asperities on the package substrate and a pair of projections 53 for dividing the package substrate. The profile grinding tool 51 has a cylindrical base 52 having an axis extending in a horizontal direction (parallel to the sheet plane of FIG. 5). The pair of projections 53 are formed on the cylindrical surface of the base 52. That is, each projection 53 is a circular projection projecting radially outward from the outer circumferential surface of the cylindrical base 52. The pair of projections 53 are spaced from each other in the axial direction of the cylindrical base 52. The cylindrical surface of the base 52 is uneven between the pair of projections 53 as viewed in side elevation in such a manner that a plurality of ridges and grooves are alternately arranged in the axial direction of the cylindrical base 52. The uneven working surface 54 is formed by electrodepositing abrasive grains such as diamond abrasive grains on the uneven cylindrical surface of the base 52. Each projection 53 also has a similar working surface formed by electrodeposition of abrasive grains. The height of each ridge of the working surface 54, that is, the depth of each groove of the working surface 54 is set smaller than the distance from the upper surface 21 of each semiconductor chip 12 to the upper surface 22 of the resin layer 13.

In operation, the wiring substrate 11 of the package substrate 15 is held through the holding tape 36 on a chuck table (not depicted). Thereafter, the pair of projections 53 of the profile grinding tool 51 are aligned with predetermined adjacent ones of the division lines at a position horizontally outside the package substrate 15. That is, the spacing between the pair of projections 53 is set equal to the pitch of the division lines. Thereafter, the profile grinding tool 51 is lowered at the position horizontally outside the package substrate 15 until the lower end of each projection 53 becomes lower in level than the upper surface of the holding tape 36 and the working surface 54 becomes lower in level than the upper surface 22 of the resin layer 13 and higher in level than the upper surface 21 of each semiconductor chip 12. In this condition, the package substrate 15 is moved in a horizontal direction (in a direction perpendicular to the sheet plane of FIG. 5) as rotating the profile grinding tool 51 about its horizontal axis parallel to the sheet plane of FIG. 5, thereby working the package substrate 15 along the predetermined adjacent division lines.

That is, the package substrate 15 is fully cut by the pair of projections 53, and at the same time the ridges and grooves of the working surface 54 are transferred to the upper surface 22 of the resin layer 13 in an area between the predetermined adjacent division lines. Such a ridge forming and dividing operation is repeated to form a plurality of ridges and grooves on the whole of the upper surface 22 of the resin layer 13 and also divide the package substrate 15 along all the division lines extending in a first direction. Thereafter, the chuck table is rotated 90 degrees to similarly repeat the above ridge forming and dividing operation, thereby forming a plurality of similar ridges and grooves and dividing the package substrate 15 along all the other division lines extending in a second direction perpendicular to the first direction. Accordingly, the package substrate 15 is divided into a plurality of individual semiconductor packages 10, and at the same time a plurality of asperities each having a shape of quadrangular pyramid are formed on the upper surface 22 of the resin layer 13 of each semiconductor package 10, so that the surface area of the upper surface 22 of the resin layer 13 can be increased by the formation of the asperities to thereby improve the heat dissipation. Further, since the working surface 54 of the profile grinding tool 51 does not reach the upper surface 21 of each semiconductor chip 12 in the dividing step, there is no possibility that each semiconductor chip 12 may be damaged by the working surface 54 in forming the asperities on the upper surface 22 of the resin layer 13. After performing the dividing step, an ID mark forming step is similarly performed to form an ID mark on the side surface 26 of each semiconductor package 10 (see FIG. 4C).

In the semiconductor package manufacturing method according to the second preferred embodiment mentioned above, the profile grinding tool 51 has the two projections 53 for cutting the package substrate 15 into the individual semiconductor packages 10. That is, the package substrate 15 is divided along the division lines by using the two projections 53 of the profile grinding tool 51, thereby obtaining the individual semiconductor packages 10. Further, the upper surface 22 of the resin layer 13 is cut to the depth not reaching each semiconductor chip 12 by using the uneven working surface 54 of the profile grinding tool 51, so that the asperities can be formed on the upper surface 22 of the resin layer 13 without damage to each semiconductor chip 12, thereby increasing the surface area of the upper surface 22 of the resin layer 13. Accordingly, the heat generated from the semiconductor chip 12 of each semiconductor package 10 is transmitted to the uneven upper surface 22 of the resin layer 13 and then efficiently dissipated from the uneven upper surface 22 of the resin layer 13. In this manner, the package substrate 15 is divided and at the same time the asperities are formed on the upper surface 22 of the resin layer 13 by using the profile grinding tool 51. Accordingly, the heat dissipation from each semiconductor package 10 can be improved with a reduced number of steps.

Figure 6A:
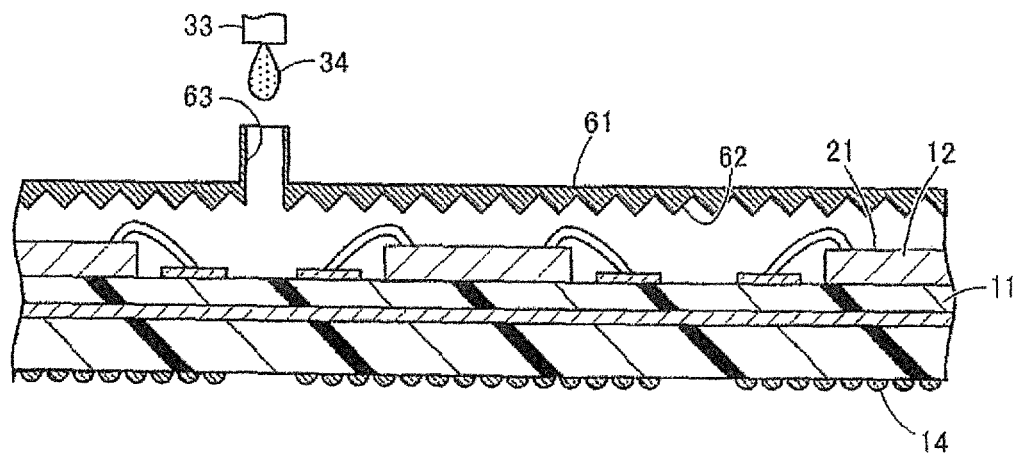
FIG. 6A is a sectional view depicting a package substrate forming step according to a third preferred embodiment of the present invention.
Figure 6B:
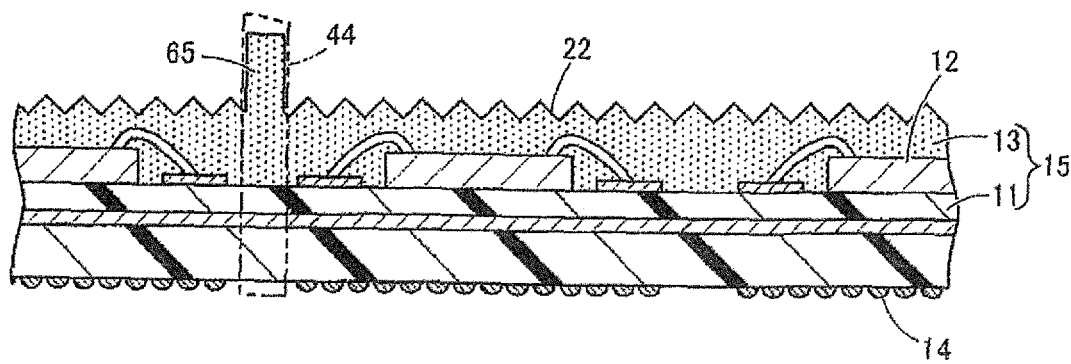
FIG. 6B is a sectional view depicting a package substrate formed by the third preferred embodiment.

A semiconductor package manufacturing method according to a third preferred embodiment of the present invention will now be described with reference to FIGS. 6A and 6B. The third preferred embodiment is different from the first preferred embodiment in the point that the package substrate forming step in the third preferred embodiment includes the steps of supplying a sealing compound into a mold to form a package substrate and simultaneously forming asperities on the upper surface of the package substrate by using this mold. Accordingly, the description of any steps other than the package substrate forming step will be omitted herein. FIGS. 6A and 6B are sectional views for illustrating the semiconductor package manufacturing method according to the third preferred embodiment.

As depicted in FIG. 6A, the package substrate forming step is performed after performing a chip bonding step in a manner similar to that mentioned above in the first preferred embodiment. In the package substrate forming step, a sealing compound 34 is supplied to the upper surface of the wiring substrate 11 on which the plural semiconductor chips 12 have been bonded, thereby sealing all the semiconductor chips 12 with the sealing compound 34 at one time to form a package substrate 15 (see FIG. 6B). More specifically, the lower surface of the wiring substrate 11 is held by a holding jig (not depicted), and a mold 61 is set so as to cover the upper surface of the wiring substrate 11 in the condition where a space is defined between the mold 61 and the upper surface 21 of each semiconductor chip 12. That is, the mold 61 is set on the upper surface of the wiring substrate 11 so that a space is defined between the mold 61 and the upper surface 21 of each semiconductor chip 12. The mold 61 has an upper wall whose inner surface 62 is formed with a plurality of asperities each having a shape of quadrangular pyramid.

The upper wall of the mold 61 is formed with an inlet opening 63 opening to the inner surface 62, and a nozzle 33 for supplying the sealing compound 34 is positioned directly above the inlet opening 63. After curing the sealing compound 34, a resin post 65 (see FIG. 6B) corresponding to the inlet opening 63 is left. However, since the inlet opening 63 is positioned directly above any one of the division lines, the resin post 65 is not formed above the semiconductor chips 12. Further, the inlet opening 63 has an inner diameter smaller than the thickness of a straight blade 44 (see FIG. 6B) to be used in a subsequent dividing step. In operation, the sealing compound 34 is supplied from the nozzle 33 through the inlet opening 63 to the upper surface of the wiring substrate 11 until the inside space of the mold 61 is filled with the sealing compound 34, thereby sealing all the semiconductor chips 12 with the sealing compound 34. At this time, the space defined between the inner surface 62 of the mold 61 and the upper surface 21 of each semiconductor chip 12 is filled with the sealing compound 34.

After the plural semiconductor chips 12 are sealed with the sealing compound 34, the sealing compound 34 is heated or dried to be cured as depicted in FIG. 6B, thereby forming a resin layer 13 on the upper surface of the wiring substrate 11. Thereafter, the mold 61 is removed from the wiring substrate 11 to form the package substrate 15 composed of the wiring substrate 11, the plural semiconductor chips 12 mounted on the upper surface of the wiring substrate 11, and the resin layer 13 formed on the upper surface of the wiring substrate 11 so as to seal the plural semiconductor chips 12. In forming the resin layer 13 by using the mold 61, the asperities of the inner surface 62 (see FIG. 6B) of the mold 61 are transferred to the upper surface 22 of the resin layer 13, so that a plurality of asperities each having a shape of quadrangular pyramid are formed on the upper surface 22 of the resin layer 13. Accordingly, the surface area of the upper surface 22 of the resin layer 13 can be increased to thereby improve the heat dissipation. Although the resin post 65 is formed directly above the division line as depicted in FIG. 6B, the resin post 65 can be removed by the straight blade 44 in dividing the package substrate 15 in the subsequent dividing step.

The sealing compound 34 is a curable liquid resin in this preferred embodiment. Examples of the curable resin include epoxy resin, silicone resin, urethane resin, unsaturated polyester resin, acrylic urethane resin, and polyimide resin. While the sealing compound 34 is a liquid resin in this preferred embodiment, a sheet resin or a powder resin may be used instead. After performing this package substrate forming step, a holding step is performed to hold the lower surface of the wiring substrate 11 of the package substrate 15 by using a holding tape 36 (see FIG. 3C). Thereafter, a dividing step is performed to divide the package substrate 15 into the individual semiconductor packages 10 by using the straight blade 44. After performing the dividing step, an ID mark forming step is similarly performed to form an ID mark on the side surface 26 of each semiconductor package 10.

In the semiconductor package manufacturing method according to the third preferred embodiment mentioned above, the plural semiconductor chips 12 are sealed with the sealing compound 34 by using the mold 61 having the uneven inner surface 62, so that the asperities are formed on the upper surface 22 of the resin layer 13 by the uneven inner surface 62 of the mold 61, thereby increasing the surface area of the upper surface 22 of the resin layer 13. Accordingly, the heat generated from the semiconductor chip 12 of each semiconductor package 10 is transmitted to the uneven upper surface 22 of the resin layer 13 and then efficiently dissipated from the uneven upper surface 22 of the resin layer 13. In this manner, the surface area of the upper surface 22 of the resin layer 13 can be increased without any machining, so that an increase in load on an operator can be suppressed in forming the asperities on the upper surface 22 of the resin layer 13. That is, by using the mold 61 to form the asperities on the upper surface 22 of the resin layer 13, the heat dissipation from each semiconductor package 10 can be improved with a reduced number of steps.

The semiconductor package manufacturing methods according to the first to third preferred embodiments mentioned above are also applicable to a manufacturing method for a semiconductor package required to prevent so-called EMI (electro-magnetic interference). In the first to third preferred embodiments, a V groove forming step may be performed before performing the dividing step, and a shield layer forming step may be performed after performing the dividing step to thereby form a shield layer against EMI on the outer surface of each semiconductor package, so that the leakage of electromagnetic noise from each semiconductor package can be prevented by the shield layer.

Figure 7A:
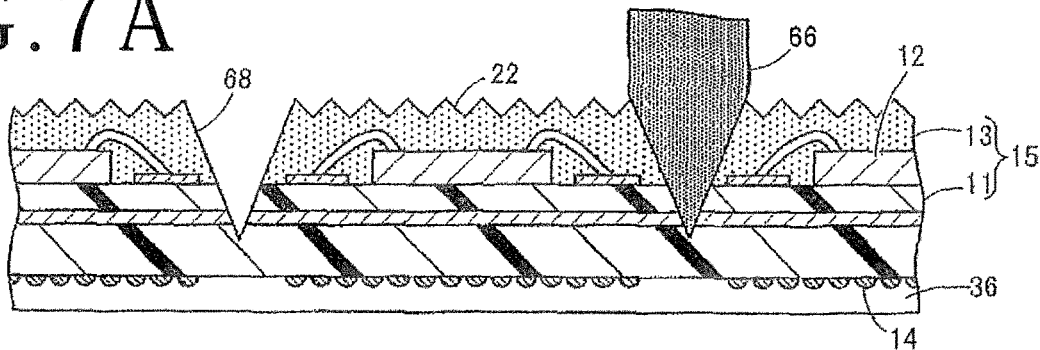
FIG. 7A is a sectional view depicting a V groove forming step according to a fourth preferred embodiment of the present invention.
Figure 7B:
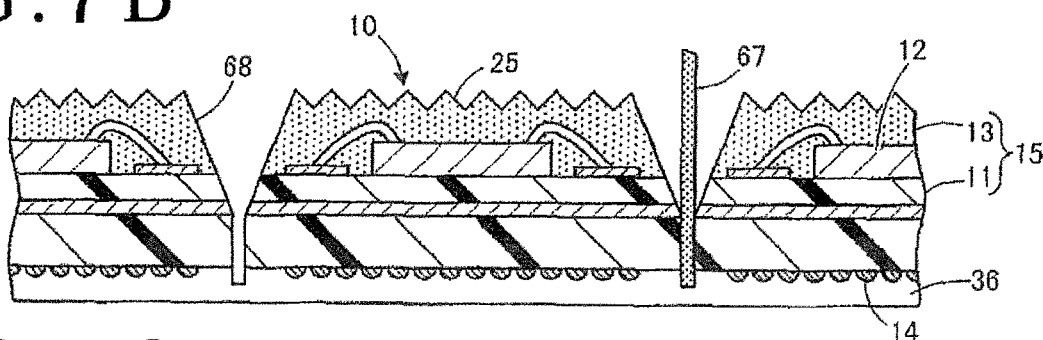
FIG. 7B is a sectional view depicting a dividing step according to the fourth preferred embodiment.
Figure 7C:
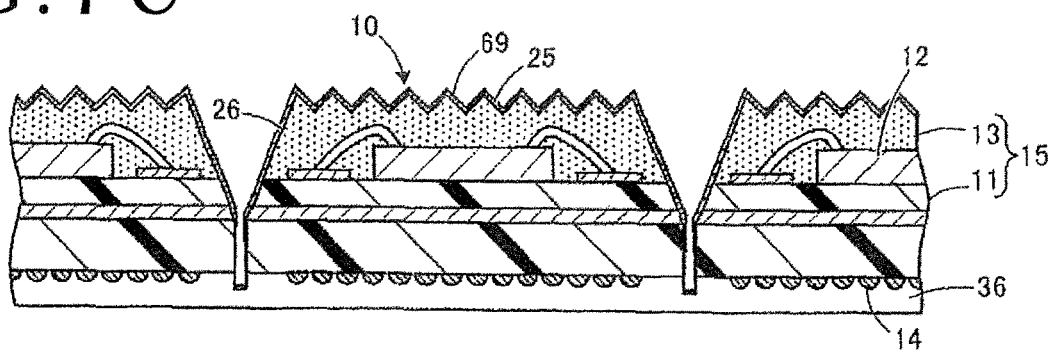
FIGS. 7C and 7D are sectional views depicting a shield layer forming step according to the fourth preferred embodiment.
Figure 7D:
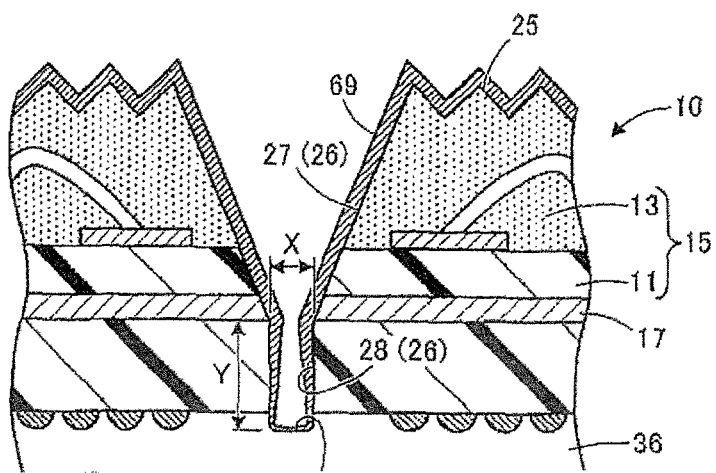

Such a manufacturing method for a semiconductor package having a shield layer will now be described with reference to FIGS. 7A to 7D, depicting a fourth preferred embodiment of the present invention. FIGS. 7A to 7D are sectional views for illustrating the semiconductor package manufacturing method according to the fourth preferred embodiment. The fourth preferred embodiment is different from the first preferred embodiment in the point that the V groove forming step and the shield layer forming step are added and that the dividing step is interposed therebetween. Accordingly, the description of any steps other than the V groove forming step, the dividing step, and the shield layer forming step will be omitted herein. FIG. 7A depicts the V groove forming step, FIG. 7B depicts the dividing step, and FIGS. 7C and 7D depict the shield layer forming step.

As depicted in FIG. 7A, the V groove forming step is performed after performing a chip bonding step, a package substrate forming step, a holding step, and a ridge forming step in a manner similar to that mentioned above in the first preferred embodiment. The V groove forming step is performed by using a disk-shaped V blade 66 having a V-shaped tip (the cutting edge of the V blade 66 having a V-shaped cross section), in which the V blade 66 is formed by fixing diamond abrasive grains or the like with a bond. In the V groove forming step, the wiring substrate 11 of the package substrate 15 is held through the holding tape 36 on a chuck table (not depicted), and the V blade 66 is aligned with each division line of the package substrate 15. Thereafter, the V blade 66 is lowered at a position horizontally outside the package substrate 15 to the depth corresponding to the middle of the thickness of the package substrate 15. Thereafter, the package substrate 15 is moved in a horizontal direction perpendicular to the sheet plane of FIG. 7A as rotating the V blade 66 about its rotation axis extending in a horizontal direction parallel to the sheet plane of FIG. 7A. Accordingly, the package substrate 15 is half cut along each division line to the depth from the upper surface 22 of the resin layer 13 to the middle of the thickness of the wiring substrate 11 by the V blade 66, thereby forming a V groove 68 along each division line as depicted in FIG. 7A.

Figure 15:
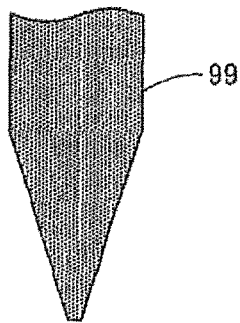
FIG. 15 is a sectional view depicting a V blade according to a modification of the fourth preferred embodiment.

While the V-shaped tip of the V blade 66 is pointed in this preferred embodiment, the V-shaped tip of the V blade 66 is not limited. That is, it is only necessary that the V-shaped tip of the V blade 66 can form the V groove 68 on the package substrate 15. For example, FIG. 15 depicts a V blade 99 as a modification of the V blade 66. As depicted in FIG. 15, the V blade 99 has a V-shaped tip with a flat end. That is, the V-shaped tip of the V blade 99 depicted in FIG. 15 is not pointed. Thus, the V-shaped tip of the V blade in the present invention is not limited to a completely V-shaped tip having a pointed end, but also includes a substantially V-shaped tip having a flat end. Further, the V-shaped tip of the V blade may be slightly rounded rather than formed by flat inclined surfaces.

As depicted in FIG. 7B, the dividing step is performed after performing the V groove forming step. In the dividing step, the wiring substrate 11 of the package substrate 15 is held through the holding tape 36 on a chuck table (not depicted), and a straight blade 67 is aligned with each V groove 68 of the package substrate 15. Thereafter, the straight blade 67 is lowered at a position horizontally outside the package substrate 15 to the depth corresponding to the middle of the thickness of the holding tape 36. Thereafter, the package substrate 15 is moved in a horizontal direction perpendicular to the sheet plane of FIG. 7B as rotating the straight blade 67 about its rotation axis extending in a horizontal direction parallel to the sheet plane of FIG. 7B. Accordingly, the package substrate 15 is fully cut along each division line (each V groove 68) by the straight blade 67, thereby dividing the package substrate 15 into the individual semiconductor packages 10.

As depicted in FIG. 7C, the shield layer forming step is performed after performing the dividing step. In the shield layer forming step, a shield layer 69 is formed on the upper surface 25 and the side surface 26 of each semiconductor package 10 by depositing a conductive material. More specifically, the individual semiconductor packages 10 divided from each other and held by the holding tape 36 are loaded into a plasma processing apparatus (not depicted), and a conductive material is next deposited to the upper surface 25 and the side surface 26 of each semiconductor package 10 under predetermined film deposition conditions by performing plasma processing such as sputtering from the upper side of each semiconductor package 10, thereby forming the shield layer 69 having a desired thickness on the upper surface 25 and the side surface 26 of each semiconductor package 10.

As depicted in FIG. 7D, an inclined surface 27 which is formed as a part of the side surface 26 of each semiconductor package 10 is inclined so as to be reverse-tapered from the upper surface 25 toward the bottom of each package substrate 10. That is, the inclined surface 27 is inclined so as to obliquely intersect the direction (vertical direction) of film deposition for the shield layer 69, so that the shield layer 69 can be easily formed in such a manner that a conductive film having a thickness capable of exhibiting a sufficient shield effect can be deposited not only on the upper surface 25, but also on the inclined surface 27 of the side surface 26. Since each asperity formed on the upper surface 25 of each semiconductor package 10 is formed by inclined surfaces, the shield layer 69 having a suitable thickness can also be formed on the inclined surfaces of each asperity of the upper surface 25.

As depicted in FIG. 7D, the side surface 26 of each semiconductor package 10 has a vertical surface 28 formed below the inclined surface 27, and a groove having a bottom 29 is formed between any adjacent ones of the semiconductor packages 10. The shield layer 69 is also formed on the vertical surface 28 of each semiconductor package 10 and the bottom 29 of each groove. Accordingly, in picking up each semiconductor package 10, there is a possibility that burrs may be generated from the shield layer 69 at a lower portion of each semiconductor package 10. In this case, the generation of the burrs in each semiconductor package 10 can be suppressed by adjusting the aspect ratio (the ratio between the width and the depth of the groove between the adjacent semiconductor packages 10) in addition to the film deposition conditions for the shield layer 69. The aspect ratio of the groove between the adjacent semiconductor packages 10 may be adjusted according to the thickness of the straight blade 67 (see FIG. 7B) and the depth of cut by the straight blade 67.

As depicted in FIG. 7D, the aspect ratio of the groove between the adjacent semiconductor packages 10 is represented by Y/X, where Y (mm) is the depth of the groove from the lower end of the inclined surface 27 (i.e., the upper end of the vertical surface 28) to the bottom 29 of the groove, and X (mm) is the width of the groove, i.e., the spacing between the opposed vertical surfaces 28 of the adjacent semiconductor packages 10. The thickness of the shield layer 69 at the lower portion of the vertical surface 28 of each side surface 27 and the bottom 29 of the groove between the adjacent semiconductor packages 10 are prone to be influenced by the aspect ratio. That is, when the aspect ratio of the groove between the adjacent semiconductor packages 10 is increased, the thickness of the shield layer 69 is reduced. Accordingly, by increasing the aspect ratio, the thickness of the shield layer 69 at the lower portion of the vertical surface 28 and at the bottom 29 of the groove formed between the adjacent semiconductor packages 10 can be reduced. That is, the thickness of the shield layer 69 formed on the inclined surface 27 of each side surface 26 becomes a suitable thickness for the shield effect because the influence of the aspect ratio is less, whereas the thickness of the shield layer 69 formed on the lower portion of the vertical surface 28 and the bottom 29 of the groove between the adjacent semiconductor packages 10 becomes a small thickness because the influence of the aspect ratio is more. Accordingly, the generation of burrs can be suppressed.

The ground line 17 in the wiring substrate 11 is exposed to the lower portion of the inclined surface 27 of each side surface 26. The shield layer 69 having a suitable thickness is formed on the lower portion of the inclined surface 27, so that the shield layer 69 is connected to the ground line 17. Accordingly, the electromagnetic noise generated in each semiconductor package 10 can be removed through the ground line 17 to the outside of each semiconductor package 10. Further, the shield layer 69 formed on the lower portion of the vertical surface 28 of each side surface 26 is thin. However, electromagnetic noise can be cut off by various wiring (not depicted) formed in the wiring substrate 11. Accordingly, the leakage of electromagnetic noise to any electronic components about each semiconductor package 10 can be generally prevented. Further, it is only essential that the ground line 17 in the wiring substrate 11 is to be connected to the shield layer 69. Accordingly, the ground line 17 may be connected to the shield layer 69 formed on the vertical surface 28 of each side surface 26.

The conductive material for forming the shield layer 69 is metal such as copper, titanium, nickel, and gold. At least one of such metals is selected to form a conductive film having a thickness of several micrometers or more as the shield layer 69. The shield layer 69 may be formed by any plasma processing such as sputtering, ion plating, and plasma chemical vapor deposition (CVD). Thusly, the upper surface 25 and the side surface 26 of each semiconductor package 10 are covered with the shield layer 69.

In this preferred embodiment, the holding tape 36 is formed of a material having resistance to plasma processing in the shield layer forming step. The resistance to plasma processing includes plasma resistance, temperature resistance, and vacuum resistance. The base sheet of the holding tape 36 is preferably formed of a material having heat resistance up to 150° C. to 170° C. For example, polyethylene naphthalate resin or polyimide resin may be selected as the material for the base sheet of the holding tape 36.

Figure 8:
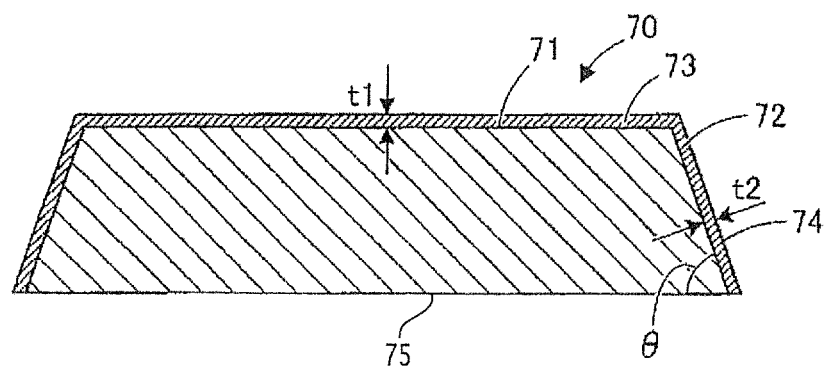
FIG. 8 is a sectional view depicting the thickness of a shield layer formed on a sample.
Figure 9:
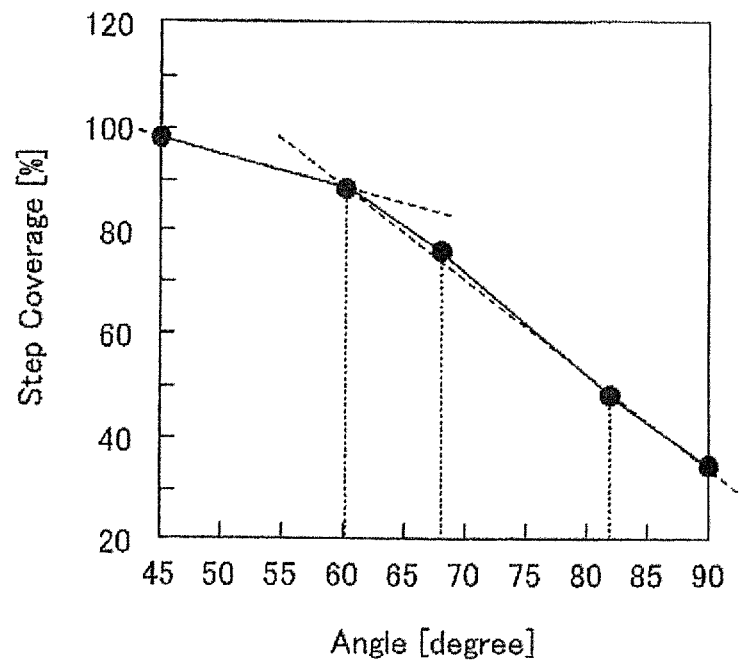
FIG. 9 is a graph depicting the relation between the angle of inclination of the side surface of the sample and the thickness of the shield layer.

There will now be described the relation between the angle of inclination of the inclined surface 27 of each semiconductor package 10 and the thickness of the shield layer 69. FIG. 8 is a sectional view depicting the thickness of a shield layer formed on a sample. FIG. 9 is a graph depicting the relation between the angle θ of inclination of the side surface of the sample and the thickness of the shield layer.

As depicted in FIG. 8, reference numeral 70 denotes a sample having an upper surface 71 and a side surface 72. The sample 70 further has a bottom surface 75 parallel to the upper surface 71. Further, an upper shield layer 73 is formed on the upper surface 71, and a side shield layer 74 is formed on the side surface 72. The side surface 72 is inclined by an angle θ with respect a vertical direction. The angle θ is defined between the side surface 72 and the bottom surface 75. The present inventor performed a test to examine the relation between the angle θ of inclination of the side surface 71 of the sample 70 and the thickness of each shield layer. In this test, a plurality of samples 70 having different inclination angles θ were prepared to form a shield layer by performing an ion plating method at a temperature of 180° C. under a pressure of 8×10$^{-4}$ Pa. The angle θ of inclination of the side surface 72 was changed to 90, 82, 68, 60, and 45 degrees. Further, the upper shield layer 73 formed on the upper surface 71 and the side shield layer 74 formed on the side surface 72 were observed by using a scanning electron microscope, and the thickness t1 of the upper shield layer 73 and the thickness t2 of the side shield layer 74 were measured according to the images obtained by the scanning electron microscope. The thicknesses t1 and t2 of the upper and side shield layers 73 and 74 were used to calculate a step coverage defined below in Eq. (1). FIG. 9 depicts the relation between the step coverage and the inclination angle θ.

$$\text{Step coverage} = (t2/t1) \times 100 \tag{1}$$

As apparent from FIG. 9, the step coverage gradually increases with a decrease in the inclination angle θ from 90 degrees, and when the inclination angle θ becomes 45 degrees, the step coverage becomes 100%. More specifically, when the inclination angle θ was set to 45 degrees, the thickness t1 of the upper shield layer 73 was equal to the thickness t2 of the side shield layer 74. That is, it was confirmed that when the inclination angle θ is 45 degrees, the thickness of the shield layer formed on the upper surface 71 and the side surface 72 of the sample 70 is uniform. Further, the present inventor found that when the step coverage becomes less than 50%, much time is required to form the side shield layer 74, resulting in an increase in process cost. Accordingly, the step coverage is preferably set to 50% or more. That is, the inclination angle θ of the inclined surface 27 of each semiconductor package 10 is preferably set to 45 to 82 degrees.

In the semiconductor package manufacturing method according to the fourth preferred embodiment mentioned above, the heat dissipation from each semiconductor package 10 can be improved and at the same time the shield layer 69 having a predetermined thickness capable of exhibiting a sufficient shield effect can be formed on the outer surface of each semiconductor package 10.

While the fourth preferred embodiment mentioned above is realized by adding the V groove forming step and the shield layer forming step to the first preferred embodiment, this configuration is merely illustrative. That is, other preferred embodiments may be realized by adding the V groove forming step and the shield layer forming step to the second preferred embodiment and the third preferred embodiment. As a modification, a dedicated profile grinding tool may be used to simultaneously perform the ridge forming step, the V groove forming step, and the dividing step.

Figure 10:
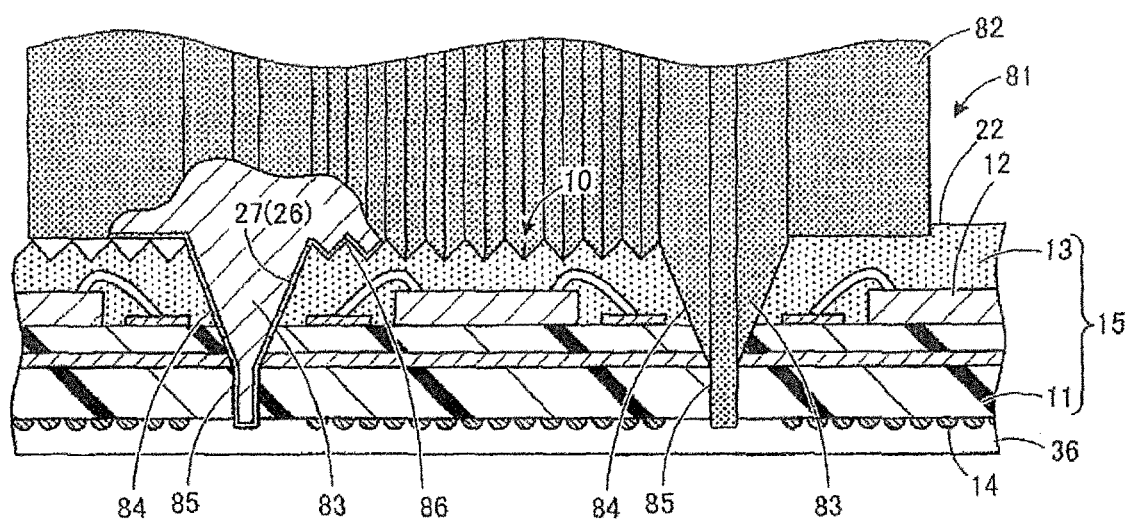
FIG. 10 is a sectional view depicting a modification of the dividing step.

This modification will now be described more specifically with reference to FIG. 10. As depicted in FIG. 10, a profile grinding tool 81 is used to simultaneously perform the ridge forming step, the V groove forming step, and the dividing step. The profile grinding tool 81 includes a cylindrical base 82 having an axis extending in a horizontal direction parallel to the sheet plane of FIG. 10 and a pair of projections 83 projecting radially outward from the cylindrical surface of the base 82, in which the pair of projections 83 are arranged so as to correspond to any adjacent ones of the plural division lines. Each projection 83 has the same shape. Each projection 83 has a taper portion having a thickness gradually decreasing from the base end (upper end as viewed in FIG. 10) toward the front end (lower end) and a straight portion projecting from the front end of the taper portion to the radially outermost end (lowermost end as viewed in FIG. 10), in which the straight portion has a fixed thickness. In other words, the side surface of each projection 83 is composed of an inclined surface 84 projecting radially outward from the cylindrical surface of the base 82 and a vertical surface 85 projecting radially outward from the radially outer end of the inclined surface 84.

Further, the cylindrical surface of the base 82 is uneven between the pair of projections 83 as viewed in side elevation in such a manner that a plurality of ridges and grooves are alternately arranged in the axial direction of the cylindrical base 82.

Further, an abrasive grain layer 86 as a working surface is formed so as to cover the cylindrical surface of the base 82 and the outer surface of each projection 83. That is, the abrasive grain layer 86 is formed on the opposite side surfaces and the front end surface of each projection 83 and also formed on the cylindrical surface of the base 82 in an area between the pair of projections 83. The abrasive grain layer 86 is formed by electrodeposition of diamond abrasive grains, for example, on the cylindrical surface of the base 82 and on the outer surface of each projection 83.

In the dividing step using this dedicated profile grinding tool 81, the package substrate 15 is fully cut along the division lines by the pair of projections 83, thereby dividing the package substrate 15 into the individual semiconductor packages 10. At the same time, the upper surface 22 of the resin layer 13 of the package substrate 15 is cut by the working surface 86 formed between the pair of projections 83, so that the ridges and grooves of the working surface 86 are transferred to the upper surface 22 of the resin layer 13. In this manner, the package substrate 15 is divided into the individual semiconductor packages 10 and at the same time the surface area of the upper surface 22 of the resin layer 13 of each semiconductor package 10 can be increased by using the profile grinding tool 81. Further, the side surface of each projection 83 has the inclined surface 84 projecting radially outward from the cylindrical surface of the base 82, so that the side surface 26 of each semiconductor package 10 has an inclined surface 27 formed by the inclined surface 84 of each projection 83, in which the inclined surface 27 of the side surface 26 of each semiconductor package 10 is inclined so as to be reverse-tapered toward the bottom of each semiconductor package 10. In this manner, the package substrate 15 can be divided into the individual semiconductor packages 10 as forming the inclined surface 27 as a part of the side surface 26 of each semiconductor package 10. At the same time, the heat dissipation from each semiconductor package 10 can also be improved.

Figure 11A:
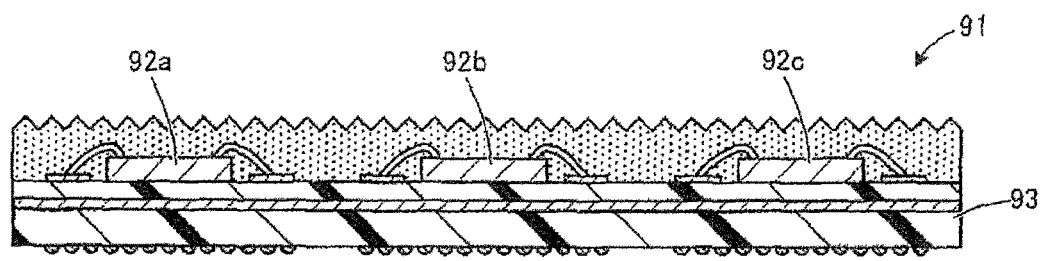
FIGS. 11A and 11B are sectional views depicting modifications of the semiconductor package in the present invention.

While each semiconductor package 10 includes the single semiconductor chip 12 mounted on the wiring substrate 11 in the above preferred embodiments, a plurality of semiconductor chips may be mounted on a wiring substrate in each semiconductor package. For example, FIG. 11A depicts a configuration such that a plurality of (e.g., three) semiconductor chips 92a, 92b, and 92c are mounted on a wiring substrate 93 and these semiconductor chips 92a, 92b, and 92c are collectively sealed with resin to manufacture a semiconductor package 91. These semiconductor chips 92a, 92b, and 92c may have the same function or may have different functions.

Figure 11B:
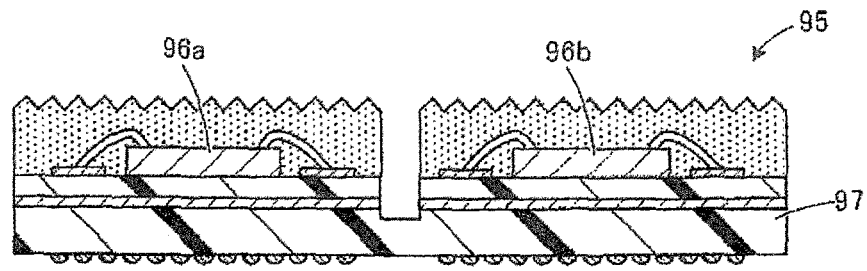

FIG. 11B depicts another configuration such that a plurality of (e.g., two) semiconductor chips 96a and 96b are mounted on a wiring substrate 11 and these semiconductor chips 96a and 96b are separately sealed with resin to manufacture a semiconductor package 95. In this case, grooves are formed on a package substrate so as to separate a plurality of semiconductor chips from each other, and the package substrate is next divided along some of these grooves on a package-by-package basis. The semiconductor chips 96a and 96b may have the same function or may have different functions.

Figure 12A:
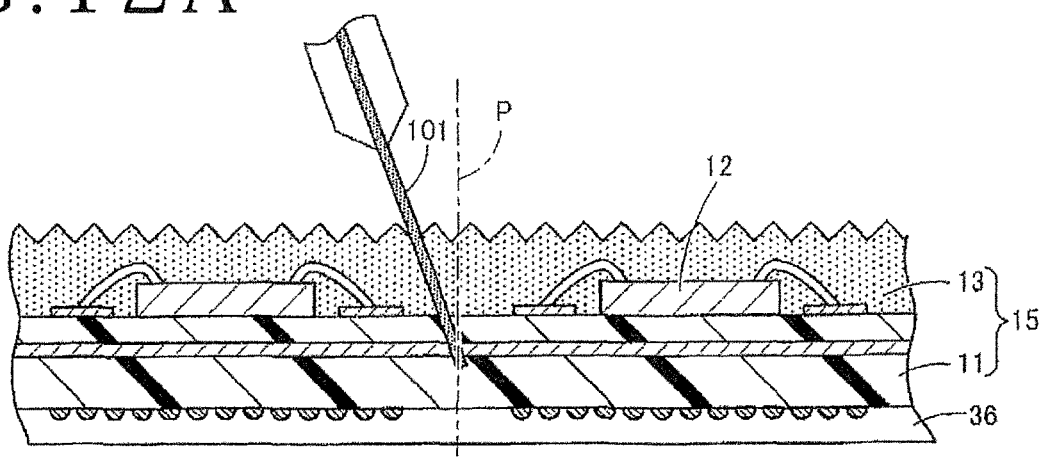
FIGS. 12A, 12B, and 12C are sectional views depicting modifications of the V groove forming step.

While the V blade 66 is used as a V groove forming unit (V groove forming means) in the V groove forming step in the fourth preferred embodiment as depicted in FIG. 7A, the configuration of the V groove forming unit is not limited. For example, FIG. 12A depicts a configuration such that usual straight blade 101 is used as the V groove forming unit to form a V groove on the package substrate 15. More specifically, the straight blade 101 is inclined by a predetermined angle to one side with respect to a vertical plane P along each division line set on the package substrate 15. In this condition, the package substrate 15 is cut by the straight blade 101 inclined to one side. Thereafter, the straight blade 101 is inclined by the above predetermined angle to the other side with respect to the vertical plane P. In this condition, the package substrate 15 is cut by the straight blade 101 inclined to the other side. Accordingly, the upper surface of the package substrate 15 is cut away by the straight blade 101 to form a V groove along each division line.

Figure 12B:
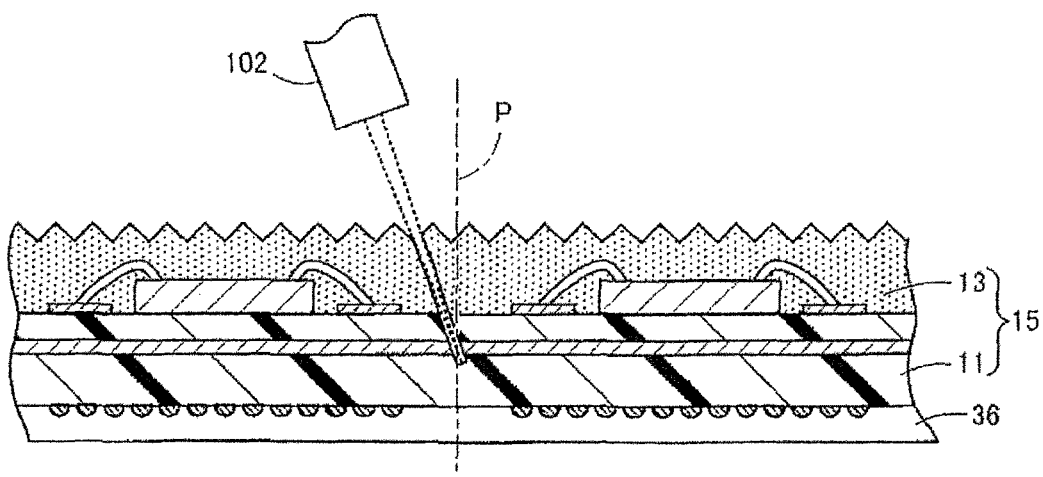

FIG. 12B depicts another configuration such that a processing head 102 for laser ablation is used as the V groove forming unit to form a V groove on the package substrate 15. More specifically, the processing head 102 is inclined by a predetermined angle to one side with respect to a vertical plane P along each division line set on the package substrate 15. In this condition, the package substrate 15 is cut by a laser beam applied from the processing head 102 inclined to one side. Thereafter, the processing head 102 is inclined by the above predetermined angle to the other side with respect to the vertical plane P. In this condition, the package substrate 15 is cut by the laser beam applied from the processing head 102 inclined to the other side. The laser beam has an absorption wavelength to the package substrate 15 to thereby effect the laser ablation to the package substrate 15. Accordingly, the upper surface of the package substrate 15 is cut away by the laser beam to form a V groove along each division line.

Figure 12C:
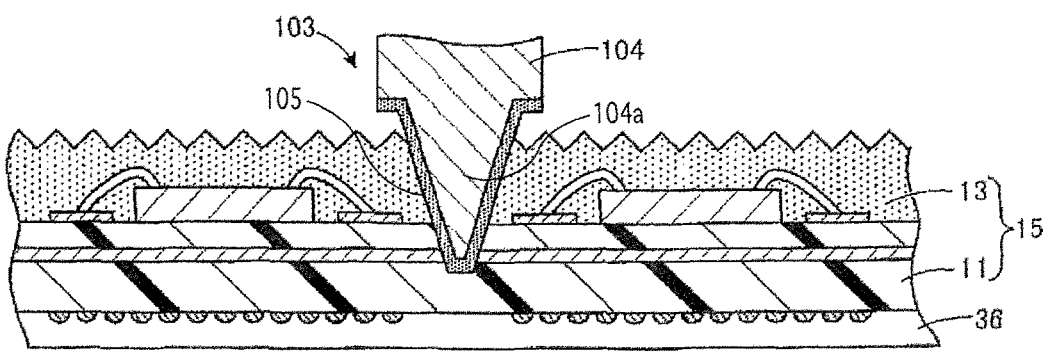

FIG. 12C depicts another configuration such that a profiler 103 is used as the V groove forming unit to form a V groove on the package substrate 15. The profiler 103 is composed of an aluminum base 104 having a substantially V-shaped projection 104a and an abrasive layer 105 formed on the outer surface of the projection 104a by electrodeposition, in which the abrasive layer 105 contains diamond abrasive grains. The profiler 103 is more resistant to wearing than the V blade 66, so that the V shape of the projection 104a of the profiler 103 can be maintained for a long period of time.

Figure 13:
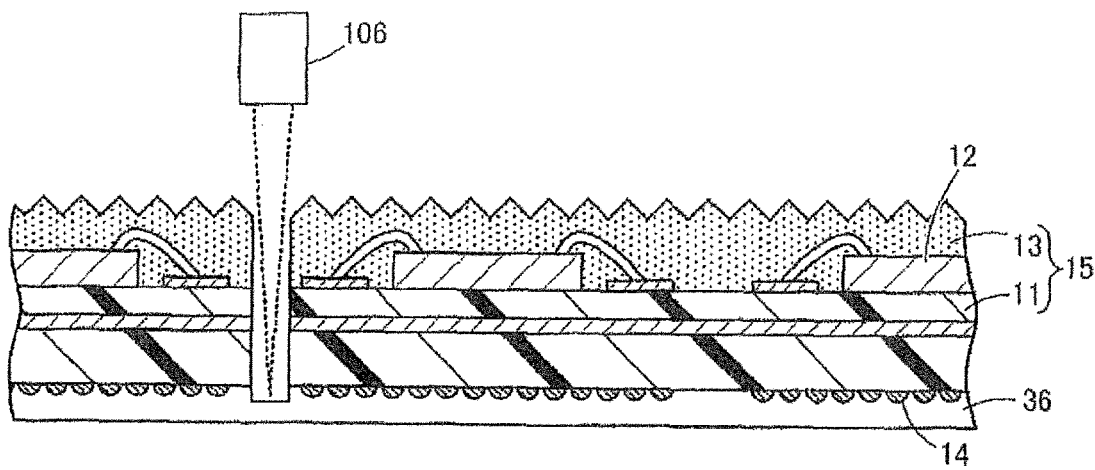
FIG. 13 is a sectional view depicting another modification of the dividing step.

While the straight blade 44 or 67 is used as a dividing unit (dividing means) in the dividing step in the above preferred embodiments, the configuration of the dividing unit is not limited. For example, FIG. 13 depicts a configuration such that a processing head 106 for laser ablation is used as the dividing unit to divide the package substrate 15. Further, while the profile grinding tool 51 having the pair of projections 53 is used as the dividing unit in the second preferred embodiment depicted in FIG. 5, a multi-blade may be used in place of the profile grinding tool 51.

Figure 14:
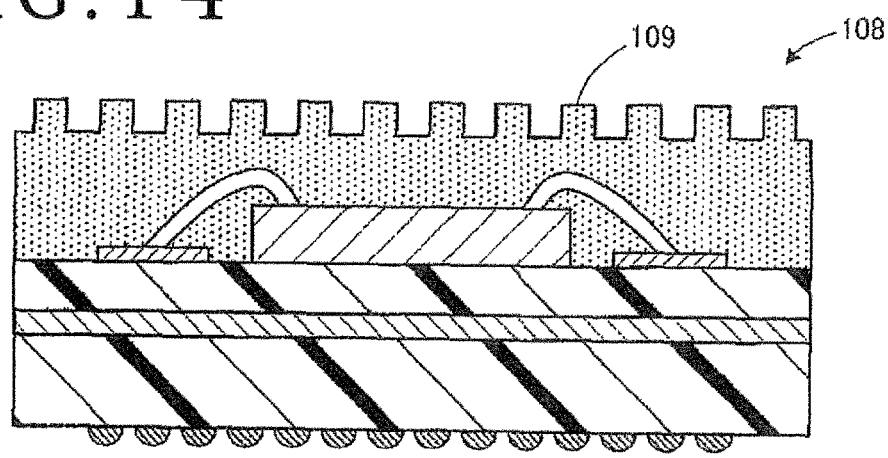
FIG. 14 is a sectional view depicting a modification of the shape of each asperity formed on the semiconductor package in the present invention.

While the shape of each asperity formed on the upper surface of the resin layer is a shape of quadrangular pyramid in the above preferred embodiments, the shape of each asperity to be formed on the upper surface of the resin layer is not limited, but may be any shape capable of increasing the surface area of the upper surface of the resin layer. For example, FIG. 14 depicts a semiconductor package 108 having an uneven upper surface 109 of a resin layer, in which each asperity of the uneven upper surface 109 has a shape of quadrangular prism. In the case that a shield layer is formed on the semiconductor package 108, each asperity to be formed on the upper surface 109 is preferably formed in consideration of the aspect ratio. That is, by reducing the aspect ratio between the spacing between any adjacent ones of the prismatic asperities and the height of each prismatic asperity, a shield layer can also be formed on the side surface of each prismatic asperity.

While each semiconductor chip is connected through the wires to the electrodes of the wiring substrate by wire bonding to manufacture each semiconductor package in the above preferred embodiments, this configuration is merely illustrative. For example, each semiconductor chip may be directly connected to the electrodes of the wiring substrate by flip chip bonding to manufacture each semiconductor package.

While the bumps are provided as electrodes on the package substrate in the above preferred embodiments, this configuration is merely illustrative. That is, the electrodes of the package substrate are not especially limited. For example, lands may be provided as the electrodes of the package substrate.

While the back side of the package substrate opposite to the resin layer is attached to the holding tape in the holding step in the above preferred embodiments, this configuration is merely illustrative. For example, the back side of the package substrate opposite to the resin layer may be held under suction on a holding jig in the holding step rather than using the holding tape, and the subsequent steps may be performed in the condition where the package substrate is held on the holding jig. The holding jig may be any jig capable of holding the package substrate, such as a chuck table and a substrate.

While the dividing step is performed after performing the ridge forming step in the first preferred embodiment, the ridge forming step may be performed after performing the dividing step.

While the holding tape attached to the package substrate is not changed in performing all the steps in the fourth preferred embodiment, this configuration is merely illustrative. For example, a holding tape for cutting may be used in the V groove forming step and the dividing step, whereas a holding tape for plasma processing may be used in the shield layer forming step.

Further, the V groove forming step and the dividing step may be performed by using the same apparatus or different apparatuses in the fourth preferred embodiment.

Further, each semiconductor package is applicable not only to mobile communication equipment such as mobile phone, but also to any other electronic equipment such as camera.

Further, the package substrate is not especially limited, but any workpiece on which a shield layer can be formed. Examples of such a workpiece include various substrates for chip size package (CSP), wafer level chip size package (WLCSP), system in package (SIP), and fan out wafer level package (FOWLP). In the case of FOWLP substrate, semiconductor chips may be mounted on a redistribution layer. Accordingly, the wiring member usable in the present invention includes not only a wiring substrate such as a printed circuit board (PCB) substrate, but also a redistribution layer in a FOWLP substrate.

Further, the above preferred embodiments and various modifications may be combined generally or partially to perform other preferred embodiments.

The present invention is not limited to the above preferred embodiments and modifications mentioned above, but various modifications, replacements, and changes may be made within the scope of the present invention. Further, if the technical idea of the present invention can be realized by any other methods using any technical progress or derivative techniques, the present invention may be embodied by using these methods. Accordingly, the present invention claimed herein is intended to cover all embodiments that may fall within the scope of the present invention.

Further, while the present invention is applied to a semiconductor package manufacturing method in the above description, the present invention is also applicable to a manufacturing method for any other packages.

As described above, the present invention has an effect such that the heat dissipation from a semiconductor package can be improved, in which the semiconductor package is obtained by sealing a semiconductor chip in a sealing layer (resin layer). In particular, the present invention is useful for a manufacturing method for a semiconductor package to be used in mobile communication equipment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor package manufacturing method for manufacturing a plurality of individual semiconductor packages, comprising:

a holding step of holding a package substrate by using a holding jig or a holding tape, the package substrate being previously formed by bonding a plurality of semiconductor chips to a plurality of separate regions on a front side of a wiring member, the separate regions being defined by a plurality of crossing division lines, and next supplying a sealing compound to the front side of the wiring member to thereby form a sealing layer from the sealing compound on the front side of the wiring member, whereby the package substrate is composed of the wiring member, the semiconductor chips bonded to the wiring member, and the sealing layer sealing the semiconductor chips, a back side of the wiring member of the package substrate being held by the holding jig or the holding tape;

a dividing step of cutting the package substrate along each division line to a depth corresponding to a middle of a thickness of the holding tape or corresponding to an inside of the holding jig by using a profile grinding tool after performing the holding step, thereby dividing the package substrate into the plurality of individual semiconductor packages;

the profile grinding tool having at least two projections arranged so as to correspond to any adjacent ones of the division lines and an uneven working surface formed between the two projections; and the dividing step including the steps of cutting the package substrate along the division lines by using the two projections to thereby divide the package substrate into the individual semiconductor packages and simultaneously cutting a front side of the sealing layer to a depth not reaching a front side of each semiconductor chip by using the uneven working surface, thereby forming a plurality of ridges and grooves on the front side of the sealing layer to thereby improve a surface area of the front side of the sealing layer.

2. The semiconductor package manufacturing method according to claim 1, further comprising an ID mark forming step of forming an ID mark on one side surface of each semiconductor package after performing the dividing step.

3. The semiconductor package manufacturing method according to claim 1, wherein the dividing step includes forming each of the grooves with a depth that is less than a distance from an upper surface of each semiconductor chip to an upper surface of the sealing layer.

4. A semiconductor package manufacturing method for manufacturing a plurality of individual semiconductor packages, comprising:
a holding step of holding a package substrate by using a holding jig or a holding tape, the package substrate being previously formed by bonding a plurality of semiconductor chips to a plurality of separate regions on the front side of a wiring member, the separate regions being defined by a plurality of crossing division lines, and next supplying a sealing compound to the front side of the wiring member to thereby form a sealing layer from the sealing compound on the front side of the wiring member, whereby the package substrate is composed of the wiring member, the semiconductor chips bonded to the wiring member, and the sealing layer sealing the semiconductor chips, a back side of the wiring member of the package substrate being held by the holding jig or the holding tape;
a ridge forming step of forming a front side of the sealing layer to a depth not reaching a front side of each semiconductor chip by using a profile grinding tool having an uneven working surface after performing the holding step, thereby forming a plurality of ridges and grooves on the front side of the sealing layer to thereby increase a surface area of the front side of the sealing layer, wherein the ridges and grooves are alternately formed on the front side of the sealing layer and each have a shape of a quadrangular pyramid; and
a dividing step of dividing the package substrate along each division line to obtain the plurality of individual semiconductor packages.

5. The semiconductor package manufacturing method according to claim 4, further comprising an ID mark forming step of forming an ID mark on one side surface of each semiconductor package after performing the dividing step.

6. The semiconductor package manufacturing method according to claim 4, wherein the ridge forming step includes forming each of the grooves with a depth that is less than a distance from an upper surface of each semiconductor chip to an upper surface of the sealing layer.

7. A semiconductor package manufacturing method for manufacturing a plurality of individual semiconductor packages, comprising:
a chip bonding step of bonding a plurality of semiconductor chips to a plurality of separate regions on a front side of a wiring member, the separate regions being defined by a plurality of crossing division lines;
a package substrate forming step of setting a mold on the front side of the wiring member so as to define a space between the mold and a front side of each semiconductor chip, the mold having an uneven inner surface, and next supplying a sealing compound into the space defined between the mold and the front side of each semiconductor chip to thereby form a sealing layer from the sealing compound on the wiring member, a front side of the sealing layer being formed with a plurality of ridges and grooves transferred from the uneven inner surface of the mold, thereby obtaining a package substrate composed of the wiring member, the semiconductor chips bonded to the wiring member, and the sealing layer sealing the semiconductor chips, and wherein the package substrate forming step includes forming a resin post above one of the division lines;
a dividing step of dividing the package substrate along each division line to obtain the plurality of individual semiconductor packages after performing the package substrate forming step; and
a shield layer forming step of depositing a conductive material on surfaces of each of the plurality of semiconductor packages.

8. The semiconductor package manufacturing method according to claim 7, further comprising an ID mark forming step of forming an ID mark on one side surface of each semiconductor package after performing the dividing step.

9. The semiconductor package manufacturing method according to claim 7, wherein the package substrate forming step includes forming each of the grooves with a depth that is less than a distance from an upper surface of each semiconductor chip to an upper surface of the sealing layer.

* * * * *